United States Patent
Kitajima (10) Patent No.: US 9,961,764 B2
(45) Date of Patent: May 1, 2018

(54) CIRCUIT MODULE

(71) Applicant: Murata Manufacturing Co., Ltd., Nagaokakyo-shi, Kyoto-fu (JP)

(72) Inventor: Hiromichi Kitajima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 110 days.

(21) Appl. No.: 14/069,402

(22) Filed: Nov. 1, 2013

(65) Prior Publication Data
US 2014/0055965 A1  Feb. 27, 2014

Related U.S. Application Data

(63) Continuation of application No. PCT/JP2012/003843, filed on Jun. 13, 2012.

(30) Foreign Application Priority Data

Jun. 21, 2011 (JP) ................. 2011-136993

(51) Int. Cl.
*H05K 1/00* (2006.01)
*H05K 1/02* (2006.01)
(Continued)

(52) U.S. Cl.
CPC ..... *H05K 1/0271* (2013.01); *H01L 23/49827* (2013.01); *H01L 23/49838* (2013.01);
(Continued)

(58) Field of Classification Search
CPC ...... H05K 1/181; H05K 1/116; H05K 1/0271; H05K 1/113; H05K 7/06; H05K 3/244;
(Continued)

(56) References Cited

U.S. PATENT DOCUMENTS 4,400,712 A * 8/1983 O'Connor ........... H01L 27/1025
257/577
4,705,917 A * 11/1987 Gates, Jr. ............. H01L 23/057
174/255
(Continued)

FOREIGN PATENT DOCUMENTS

JP    10-335518 A    12/1998
JP    11-121933 A    4/1999
(Continued)

OTHER PUBLICATIONS

Official Communication issued in International Patent Application No. PCT/JP2012/003843, dated Aug. 7, 2012.

*Primary Examiner* — Timothy Thompson
*Assistant Examiner* — Guillermo Egoavil
(74) *Attorney, Agent, or Firm* — Keating & Bennett, LLP (57) ABSTRACT

A via conductor connected to a mounting electrode near a corner portion of a circuit substrate is provided in a position in a corresponding mounting electrode, located closer to the center of the circuit substrate. Thus, concentration of a stress in a portion of the via conductor is effectively reduced, and a break, a chip, or a crack is prevented from occurring to the circuit substrate. Even if the portion located closer to the corner portion of the mounting electrode is peeled from the circuit substrate, the electrical characteristics of the circuit module are secured because disconnection between the corresponding mounting electrode and the via conductor is prevented.

11 Claims, 4 Drawing Sheets

(51) Int. Cl.
*H01L 23/498* (2006.01)
*H05K 1/11* (2006.01)
*H05K 1/18* (2006.01)
*H05K 7/06* (2006.01)
*H05K 3/46* (2006.01)

(52) U.S. Cl.
CPC ............ *H05K 1/113* (2013.01); *H05K 1/181* (2013.01); *H05K 7/06* (2013.01); *H01L 2924/0002* (2013.01); *H05K 3/4629* (2013.01); *H05K 2201/099* (2013.01); *H05K 2201/0979* (2013.01); *H05K 2201/09381* (2013.01)

(58) Field of Classification Search
CPC .. H05K 3/4605; H05K 3/3452; H05K 3/4629; H05K 3/3457; H05K 3/3478; H05K 2201/09381; H05K 2201/099; H05K 2201/10674; H05K 2201/0979; H05K 2201/0191; H05K 2201/09672; H05K 2203/041; H05K 2203/0557; H01L 2924/01047; H01L 2924/01082; H01L 2924/01038; H01L 2924/0103; H01L 2924/01015; H01L 2924/01074; H01L 2924/01029; H01L 2924/01023; H01L 2924/01019; H01L 2924/01005; H01L 2924/01033; H01L 2924/01027; H01L 2924/01; H01L 21/4846; H01L 21/4853; H01L 24/16; H01L 23/49827; H01L 23/49838; H01L 23/49816; H01L 23/49811; H01L 23/49822; H01L 2224/16235; H01L 2224/81192; H01L 2224/11334; H01L 2224/16; H01L 2224/13099; H01L 2224/73204; H01L 2224/32225; H01L 2224/16225; H01L 2924/0002; H01L 2924/01078; H01L 2924/014; H01L 2924/01061; H01L 2924/0102; H01L 2924/12042; H01L 2924/181; H01L 2924/01006; H01L 2924/01088; H01L 2924/01011; H01L 2924/14; H01L 2924/01079; H01L 2924/19041; H01L 2924/15311; Y10T 29/49165; Y10T 29/4913; Y10T 29/49124; Y10T 29/49126; Y10T 29/49144; Y10T 29/49117
USPC ......... 174/261, 262, 250; 361/752; 257/774, 257/778, 766, 781, E23.06, E23.062, 257/E23.068, E23.069, 738; 438/613, 438/614
See application file for complete search history.

(56) References Cited

U.S. PATENT DOCUMENTS

| | | | | |
|---|---|---|---|---|
| 5,357,403 | A * | 10/1994 | Haller | H01L 23/538 174/255 |
| 5,855,049 | A * | 1/1999 | Corbett, III | B06B 1/0622 219/121.85 |
| 6,091,155 | A * | 7/2000 | Jonaidi | H01L 23/49816 257/738 |
| 6,329,969 | B1* | 12/2001 | Yano | G02F 1/1345 345/183 |
| 7,962,105 | B2* | 6/2011 | Sato et al. | 455/78 |
| 2005/0189645 | A1 | 9/2005 | Nakano | H05K 1/162 257/701 |
| 2005/0253263 | A1* | 11/2005 | Sugimoto | H01L 21/4846 257/737 |
| 2006/0044735 | A1* | 3/2006 | Hayashi | H01L 23/49816 361/313 |
| 2006/0198079 | A1* | 9/2006 | Shim | H01G 2/06 361/306.3 |
| 2006/0284300 | A1* | 12/2006 | Nishizawa et al. | 257/687 |
| 2007/0139294 | A1* | 6/2007 | Dunn | H05K 1/162 343/909 |
| 2007/0210866 | A1* | 9/2007 | Sato | H03F 3/195 330/126 |
| 2008/0203173 | A1* | 8/2008 | Baba | G06K 19/07749 235/492 |
| 2008/0204163 | A1* | 8/2008 | Royak | H01P 1/20345 333/132 |
| 2009/0057887 | A1* | 3/2009 | Mclellan | H01L 23/16 257/737 |
| 2009/0145643 | A1* | 6/2009 | Tanaka | H05K 1/167 174/260 |
| 2009/0174084 | A1* | 7/2009 | Jadhav | H01L 24/12 257/786 |
| 2009/0212407 | A1* | 8/2009 | Foster | B81B 7/0006 257/686 |
| 2009/0251869 | A1* | 10/2009 | Ikeda | H05K 1/113 361/748 |
| 2009/0314535 | A1* | 12/2009 | Kusumoto | H05K 1/111 174/260 |
| 2010/0032843 | A1* | 2/2010 | Chen | H01L 21/6835 257/773 |
| 2011/0147951 | A1* | 6/2011 | Murayama | H01L 23/49827 257/778 |
| 2012/0037414 | A1* | 2/2012 | Tanaka | 174/260 |
| 2012/0241906 | A1* | 9/2012 | Nakanishi | 257/532 |

FOREIGN PATENT DOCUMENTS

| | | |
|---|---|---|
| JP | 2000-244106 A | 9/2000 |
| JP | 2005-026312 A | 1/2005 |
| JP | 2005-191041 A | 7/2005 |
| JP | 2006-014029 A | 1/2006 |
| JP | 2006-128300 A | 5/2006 |
| JP | 2006128300 A * | 5/2006 |
| JP | 2011-096819 A | 5/2011 |

* cited by examiner

CIRCUIT MODULE

BACKGROUND OF THE INVENTION

1. Field of the Invention

The present invention relates to a circuit module including a circuit substrate in which a plurality of land-shaped mounting electrodes are provided on one main surface.

2. Description of the Related Art

In recent years, further downsizing of mobile terminals has been desired, and further miniaturization and further lowering of heights of circuit modules (high-frequency electronic modules) to be mounted on the mother substrates or the like of mobile terminals has been requested, examples of the circuit modules including a Bluetooth module (registered trademark), a wireless LAN module such as WiFi, and an antenna switch module used for a cellular phone. Such a circuit module includes a circuit substrate where a semiconductor element such as a transistor, an FET, a diode, or an IC or a component such as a resistance element, a capacitor element, or an inductor element is mounted on the front surface of the circuit substrate and a plurality of land-shaped mounting electrodes are formed on the back surface thereof. In addition, since the miniaturization of circuit modules and the lowering of the heights thereof have been requested, the miniaturization of circuit substrates included in the circuit modules has been advanced, and the miniaturization of mounting electrodes formed on the circuit substrates has also been advanced.

With the progress of the miniaturization of mounting electrodes formed on a circuit substrate included in a circuit module in this way, there is a possibility that torsion or a stress is concentrated in a portion on which a mounting electrode in the circuit substrate configuring the circuit module is formed, and a break, a chip, a crack, or the like occurs in the circuit substrate, the torsion being applied to the circuit substrate when the circuit module is mounted on the mother substrate or the like at the time of the assembly of a mobile terminal, the stress being due to an impact or the like occurring, for example, when a mobile terminal has fallen that includes a mother substrate on which the circuit module is mounted via solder or the like.

In addition, the circuit module is repeatedly heated and cooled or an external impact is applied thereto, for example, when the circuit module is mounted on a mother substrate in a mobile terminal or the like and hence, in particular corner portions in the four corners of the circuit substrate may be curved or warped. Therefore, there is a possibility that a mounting electrode is peeled from the circuit substrate. In this way, when a break, a chip, or a crack has occurred in the circuit substrate or a mounting electrode has been peeled from the circuit substrate, a via conductor in the circuit substrate or a transmission line such as a wiring pattern formed within the circuit substrate is damaged, and hence, there is a possibility that a failure of the mobile terminal is caused.

Therefore, so as to prevent a break, a chip, or a crack from occurring in the circuit substrate or a mounting electrode from being peeled from the circuit substrate, it has been proposed that, as for four mounting electrodes formed close to four corners of a circuit substrate, corner portions closest to the four corners of the circuit substrate are cut off and chamfered For example, refer to Japanese Unexamined Patent Application Publication No. 2005-26312, paragraphs [0001] to [0029], FIG. 1, or the like.

Figure 5:
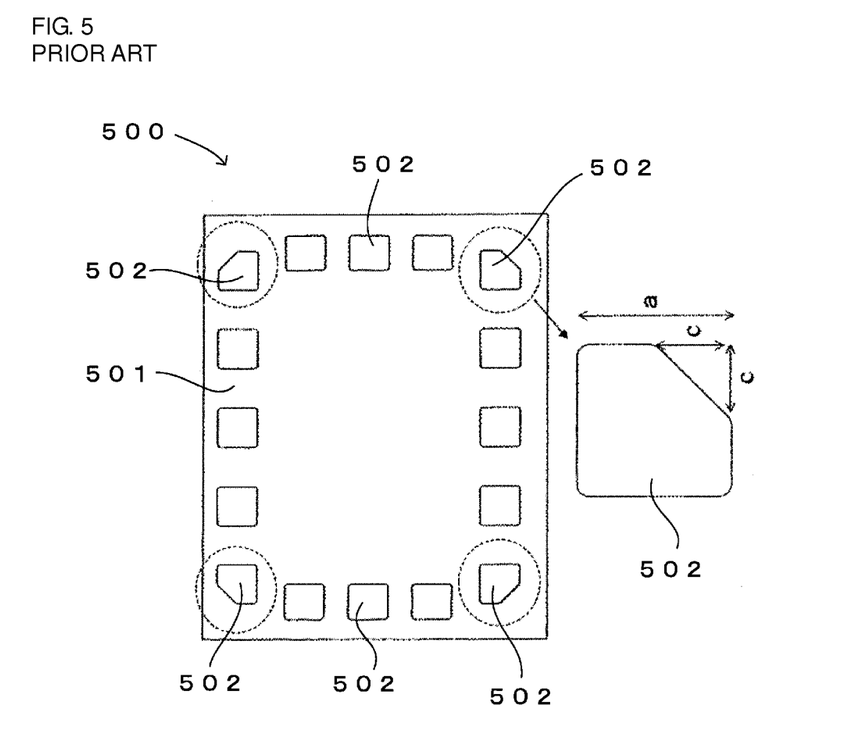
FIG. 5 is a bottom view illustrating an example of a circuit substrate of the related art.

In other words, as illustrated in the bottom view of a circuit module of the related art in FIG. 5, in a circuit substrate 501 included in a circuit module 500, from among a plurality of rectangular-shaped mounting electrodes 502 formed on a main surface on a side to be mounted on a mother substrate, as for the four mounting electrodes 502 formed close to the four corners of the circuit substrate 501 and surrounded by dotted lines in the drawing, corners closest to the four corners are subjected to chamfering so that a chamfering amount c becomes a/5 to a/2 ("a" is the length of the shortest side of the mounting electrode 502). Since such a configuration is adopted, a stress applied to the circuit substrate 501 by an external impact such as torsion applied to the circuit substrate 501 is reduced, and a break, a chip, a crack, or the like are prevented from occurring in the circuit substrate 501. In addition, when curves or warps occur in the vicinity of the four corners of the circuit substrate 501 due to the heating or the cooling or the application of the external impact, in particular portions in the mounting electrodes 502, which are close to the four corners of the circuit substrate 501, are prevented from being peeled from the circuit substrate 501.

As illustrated in FIG. 5, as for the four mounting electrodes 502 formed close to the four corners of the circuit substrate 501, corners closest to the four corners of the circuit substrate 501 are subjected to chamfering, and hence, a break, a chip, a crack, or the like are prevented from occurring in the circuit substrate 501 due to the external impact or the mounting electrode 502 is prevented from being peeled due to the circuit substrate 501 being curved. However, the further improvement of the technique has been desired.

SUMMARY OF THE INVENTION

In view of the above-mentioned problems, preferred embodiments of the present invention provide a technology that effectively prevents a break, a chip, or a crack from occurring in a circuit substrate, and secures electrical characteristics of a circuit module even if a portion of the mounting electrode is peeled from the circuit substrate.

A circuit module according to a preferred embodiment of the present invention includes a circuit substrate in which a plurality of land-shaped mounting electrodes are located on one main surface, wherein a via conductor is connected to at least one of the mounting electrodes located in a vicinity of a corner portion of the circuit substrate, and the via conductor is provided in a position in the mounting electrode located closer to a center of the circuit substrate.

In addition, it is desirable that, in the mounting electrode in the vicinity of the corner portion of the circuit substrate, another via conductor is further connected to a position located closer to the corner portion of the circuit substrate. Since, by adopting such a structure, an electrical connection state between the mounting electrode and the via conductor provided in a position in the corresponding mounting electrode is maintained, the position being located closer to the center of the circuit substrate. Therefore, it is possible to prevent the electrical characteristics of the circuit module from being deteriorated.

In addition, it is desirable that an insulation layer located on the one main surface of the circuit substrate is further included and the insulation layer is arranged to cover at least a portion of an end surface on the one main surface side in the via conductor located closer to the center of the circuit substrate. By adopting such a structure, it is possible to prevent a portion of the mounting electrode, to which the via conductor is connected, from being peeled from the circuit substrate when the circuit substrate is curved or rolled.

In addition, it is desirable that the insulation layer is arranged to cover circumferential portions of the individual mounting electrodes. Since, by adopting such a structure, the strength of the circuit substrate is further improved, it is possible to prevent a break, a chip, or a crack from occurring in the circuit substrate.

In addition, the mounting electrode including the via conductor preferably is disposed on a diagonal line on the one main surface of the circuit substrate. By adopting such a structure, the concentration of a stress in a portion of the via conductor is more effectively reduced, and it is possible to prevent a break, a chip, or a crack from occurring in the circuit substrate.

According to various preferred embodiments of the present invention, from among a plurality of land-shaped mounting electrodes located on one main surface of a circuit substrate, a via conductor connected to a mounting electrode located in the vicinity of a corner portion of the circuit substrate is provided in a position in the corresponding mounting electrode, located closer to the center of the circuit substrate, and hence, a distance between the corner portion of the circuit substrate and the via conductor becomes large. Therefore, since the concentration of a stress in a portion of a via conductor is reduced, it is possible to effectively prevent a break, a chip, or a crack from occurring in the circuit substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
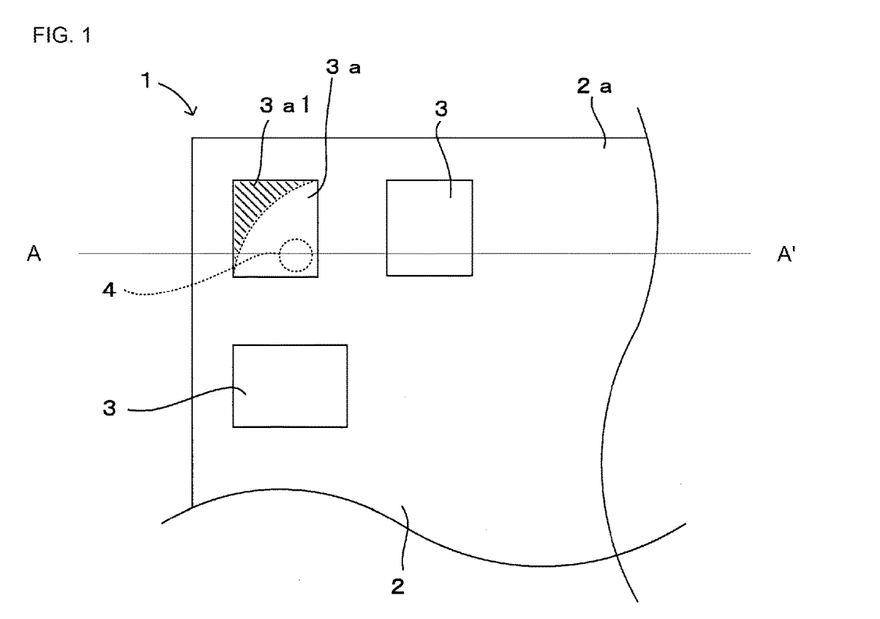
FIG. 1 is a main portion enlarged view of a bottom surface, which illustrates a first preferred embodiment of a circuit module of the present invention.

A first preferred embodiment of a circuit module of the present invention will be described with reference to FIG. 1. FIG. 1 is a main portion enlarged view of a bottom surface, which illustrates the first preferred embodiment of the circuit module of the present invention.

Figure 6:
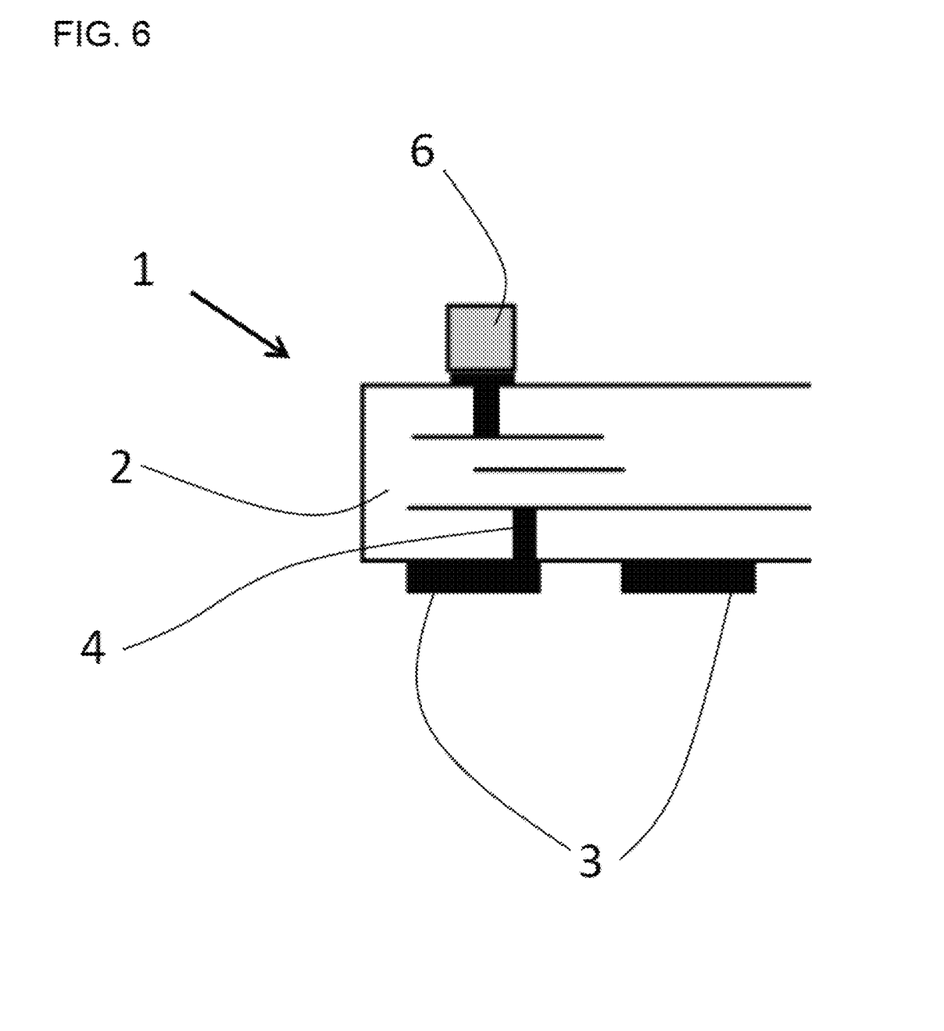
FIG. 6 is a schematic cross-sectional view along the line A-A' in FIG. 1, which illustrates a circuit module according to a preferred embodiment of the present invention in which an electronic component is mounted on a circuit substrate.

A circuit module 1 illustrated in FIG. 1 and FIG. 6 includes a circuit substrate 2 including a ceramic multilayer substrate where an electronic component 6, which may be a semiconductor element such as, for example, an amplifier including a transistor or an FET, a diode, or a switch or a component such as a resistance element, a capacitor element, or an inductor element is mounted on at least the front surface (the other main surface) of the ceramic multilayer substrate and land-shaped surface mounting electrodes 3 and 3a are provided on a back surface 2a (one main surface) thereof, and the circuit module 1 is configured as a module, examples of which include a Bluetooth module (registered trademark), a wireless LAN module such as WiFi, and an antenna switch module used for a cellular phone. In addition, as for the front surface of the circuit substrate 2, in which various kinds of components whose illustration is omitted are to be mounted, the whole front surface is molded using a commonly-used mold resin such as an epoxy based resin, in a state where the various kinds of components are mounted. In addition, instead of molding the front surface of the circuit substrate 2 using the mold resin, the front surface of the circuit substrate 2 may also be covered on the front surface of the circuit substrate 2, no mold layer and no metal case may be provided and the circuit module 1 may also be provided.

The laminated body of ceramic green sheets is fired, and hence, the circuit substrate 2 is formed. Ceramic green sheets defining the individual layers of the circuit substrate 2 are obtained preferably by a slurry being converted to a sheet using a film forming apparatus wherein mixed powders such as aluminum oxide and glass are mixed with an organic binder, a solvent, and the like and thus the slurry is obtained, and the ceramic green sheets are configured so as to be capable of being subjected to so-called low-temperature firing at a temperature lower than about 1000° C., for example. In addition, various types of pattern printing due to via formation and a conductive paste such as Ag or Cu are performed on ceramic green sheets cut into predetermined shapes, and individual layers are formed.

In other words, first, via holes are formed in a green sheet formed into a predetermined shape, using a laser or the like, the inside thereof is filled with a conductive paste or subjected to via-filling plating, and hence, a via conductor 4 used for interlayer connection is formed. In addition to this, a predetermined wiring pattern including the mounting electrodes 3 and 3a is printed using a conductive paste such as Cu or Ag, and a plurality of green sheets are prepared that are used to form the individual layers configuring the circuit substrate 2. In addition, in each green sheet, a plurality of wiring patterns are provided so that it is possible to form a large number of circuit substrates 2 at once.

Next, individual layers are laminated, and a laminated body is formed. In addition, grooves used to divide into individual circuit substrates 2 after firing are formed so as to surround the regions of the individual circuit substrates 2. Subsequently, the laminated body is fired while being subjected to pressurization, and hence the cluster of the circuit substrates 2 is formed.

In addition, Ni plating and Au plating are performed on the mounting electrodes 3 and 3a formed on the back surface 2a before division into the individual circuit substrates 2, and the circuit substrate 2 is completed after the division into the individual circuit substrates 2. In addition, before the division into the individual circuit substrates 2, various kinds of components may also be mounted on the surface of the cluster of the circuit substrates 2. In addition, the mounting surface 2a of the cluster of the circuit substrates 2 in which various kinds of components have been mounted is filled with a mold resin, this is thermally cured, and hence, a mold layer (the illustration thereof is omitted) is provided in each circuit substrate 2. Accordingly, the cluster of the circuit modules 1 is formed. After that, the cluster of the circuit modules 1 is divided into the individual circuit modules 1, and the circuit module 1 is completed.

In addition, while the via conductors 4 are individually connected to the plural mounting electrodes 3 and 3a located on the back surface 2a of the circuit substrate 2, the via conductor 4 connected to the mounting electrode 3a located in a vicinity of the corner portion of the circuit substrate 2 is provided in a position in the mounting electrode 3a, located closer to the center of the circuit substrate 2, as illustrated in FIG. 1. In addition, the individual mounting electrodes 3 and 3a provided on the back surface 2a of the circuit substrate 2 are electrically connected to various kinds of components mounted on the front surface through the via conductors 4 (the illustration of a portion thereof is omitted) and a wiring pattern provided within the circuit substrate 2. In addition, in FIG. 1, the illustration of the via conductors 4 connected to the other mounting electrodes 3 is omitted.

As described above, according to this preferred embodiment, as a result of the fact that the analysis of a stress occurring in the circuit substrate 2 caused by the application of an impact from the outside was repeatedly performed in the circuit module 1 including the rectangular-shaped circuit substrate 2 where the plural land-shaped mounting electrodes 3 and 3a are provided on the back surface 2a thereof, it was discovered that a large stress causing a break, a chip, or a crack in the circuit substrate 2 occurs with greater frequency when the mounting electrodes 3 and 3a are disposed on diagonal lines in the vicinity of the four corner portions of the circuit substrate 2. As a result, if the via conductors 4 whose material is different form the circuit substrate 2 are provided in the vicinity of the four corner portions of the circuit substrate 2, a stress turns out to be concentrated in a portion of the via conductor 4, whose mechanical strength is weak. Therefore, it becomes easy for a break, a chip, or a crack to occur in the circuit substrate 2.

Accordingly, from among the plural mounting electrodes 3 and 3a located on one main surface of the circuit substrate 2, the via conductor 4 connected to the mounting electrode 3a located in the vicinity of a corner portion of the circuit substrate 2 is provided in a position in the corresponding mounting electrode 3a, located closer to the center of the circuit substrate 2, and hence, a distance between the corner portion of the circuit substrate 2 and the via conductor 4 becomes large. Therefore, the concentration of a stress in a portion of the via conductor 4 is effectively reduced, and it is possible to effectively prevent a break, a chip, or a crack from occurring in the circuit substrate 2.

In addition, even if a portion 3a1 (a shaded portion in FIG. 1) located closer to the corner portion of the mounting electrode 3a has been peeled from the circuit substrate 2 due to the occurrence of a curve or rolling in the vicinity of the corner portion of the circuit substrate 2 in particular when the front surface of the circuit substrate 2 has been filled with a mold resin and has been thermally cured, it is possible to secure the electrical characteristics of the circuit module 1. The reason is that since the via conductor 4 is provided in a position in the mounting electrode 3a, located closer to the center of the circuit substrate 2, disconnecting between the corresponding mounting electrode 3a and the via conductor 4 is avoided.

Second Preferred Embodiment

Figure 2:
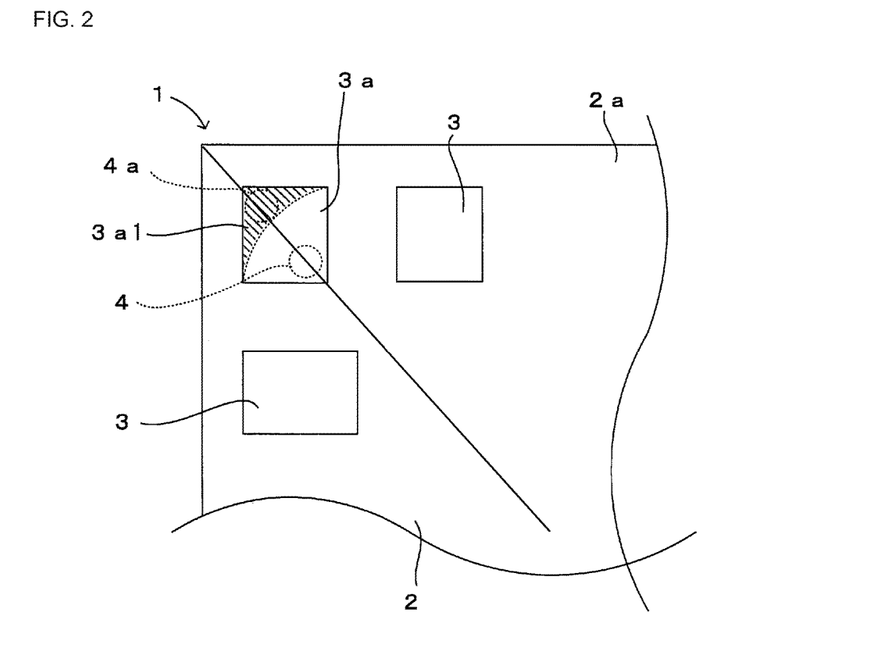
FIG. 2 is a main portion enlarged view of a bottom surface, which illustrates a second preferred embodiment of a circuit module of the present invention.

A second preferred embodiment of the circuit module of the present invention will be described with reference to FIG. 2. FIG. 2 is the main portion enlarged view of a bottom surface, which illustrates the second preferred embodiment of the circuit module of the present invention.

This preferred embodiment is different from the above-mentioned first preferred embodiment in that, as illustrated in FIG. 2, another via conductor 4a is further connected to a position located closer to the corner portion of the circuit substrate 2, in the mounting electrode 3a in the vicinity of the corner portion of the circuit substrate 2. Since the other configuration is the same as the above-mentioned first preferred embodiment, the same symbol is assigned, and hence, the description of the configuration will be omitted.

According to this preferred embodiment, in the mounting electrode 3a in the vicinity of the corner portion of the circuit substrate 2, the other via conductor 4a is further connected to a position located closer to the corner portion of the circuit substrate 2. Therefore, a stress occurring in the circuit substrate 2 due to an external impact or the like is concentrated in the via conductor 4a provided in a position located closer to the corner portion of the circuit substrate 2. Accordingly, since a break, a chip, a crack, or the like occurs in a portion of the via conductor 4a provided in a position located closer to the corner portion of the circuit substrate 2, an electrical connection state between the mounting electrode 3a and the via conductor 4 provided in a position in the corresponding mounting electrode 3a is maintained, the position being located closer to the center of the circuit substrate 2. Therefore, it is possible to prevent the electrical characteristics of the circuit module 1 from being deteriorated.

In addition, in the same way as the above-mentioned first preferred embodiment, even if a portion 3a1 (a shaded portion in FIG. 2) located closer to the corner portion of the mounting electrode 3a has been peeled from the circuit substrate 2 due to the occurrence of a curve or rolling in the vicinity of the corner portion of the circuit substrate 2, it is possible to secure the electrical characteristics of the circuit module 1. The reason is that since the via conductor 4 is provided in a position in the mounting electrode 3a, located closer to the center of the circuit substrate 2, disconnecting between the corresponding mounting electrode 3a and the via conductor 4 is prevented.

Third Preferred Embodiment

Figure 3:
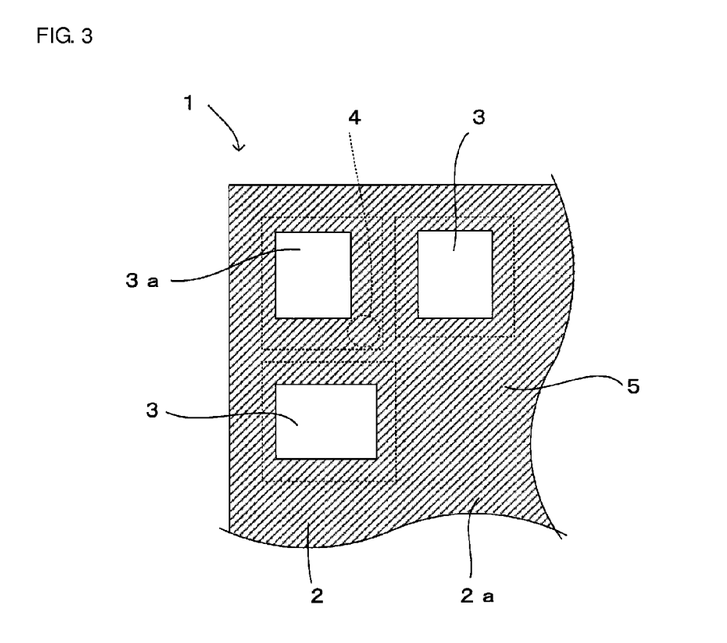
FIG. 3 is a main portion enlarged view of a bottom surface, which illustrates a third preferred embodiment of a circuit module of the present invention.

A third preferred embodiment of a circuit module of the present invention will be described with reference to FIG. 3. FIG. 3 is the main portion enlarged view of a bottom surface, which illustrates the third preferred embodiment of the circuit module of the present invention.

This preferred embodiment is different from the above-mentioned first preferred embodiment in that, as illustrated in FIG. 3, an insulation layer 5 provided on the back surface 2a of the circuit substrate 2 is further included and the insulation layer 5 is arranged to cover the circumferential portions of the individual mounting electrodes 3 and 3a. In addition, the insulation layer 5 is formed using a commonly-used resist material such as a thermosetting epoxy resin, or a ceramic paste. Since the other configuration is preferably the same or substantially the same as the above-mentioned first preferred embodiment, the same symbol is assigned, and hence, the description of the configuration will be omitted.

According to this preferred embodiment, since the insulation layer 5 is arranged to cover the circumferential portions of the individual mounting electrodes 3 and 3a, it is possible to prevent the mounting electrodes 3 and 3a from being peeled from the circuit substrate 2 when the circuit substrate 2 has been curved or rolled due to, for example, the contraction of a mold resin molding the front surface of the circuit substrate 2. In addition to this, since the strength of the circuit substrate 2 is further improved by the insulation layer 5, it is possible to prevent a break, a chip, or a crack from occurring in the circuit substrate 2.

In addition, while, in this preferred embodiment, the insulation layer 5 is arranged to cover the circumferential portions of the individual mounting electrodes 3 and 3a, the insulation layer 5 is arranged to cover at least a portion of an end surface on a back surface 2a side, in the via conductor 4 provided in a position in the mounting electrode 3a, the position being located closer to the center of the circuit substrate 2. Therefore, it is possible to prevent a portion of the mounting electrode 3a, in particular, a portion to which the via conductor 4 is connected, from being peeled from the circuit substrate 2 when the circuit substrate 2 has been curved or rolled, and it is possible to prevent an electrical connection between the mounting electrode 3a and the via conductor 4 from being deteriorated. In addition, even if such a configuration is adopted, the strength of the circuit substrate 2 is improved by the insulation layer 5. Therefore, it is possible to prevent a break, a chip, or a crack from occurring in the circuit substrate 2.

In addition, the present invention is not limited to the above-mentioned preferred embodiments, and various modifications may be made in addition to the above-mentioned preferred embodiments, without departing from the scope thereof. In addition, while, in the above-mentioned preferred embodiments, the circuit substrate 2 preferably includes the ceramic multilayer substrate, the circuit substrate 2 may also include a resin multilayer substrate of an epoxy type or a liquid crystal polymer, and the circuit substrate 2 may also include single-layer substrates such as alumina substrates.

In addition, while, in the above-mentioned preferred embodiments, the mounting electrodes 3 and 3a on the back surface 2a of the circuit substrate 2 are preferably rectangular or substantially rectangular, the shapes of the mounting electrodes 3 and 3a are not limited to the above-mentioned shapes, and may also be arbitrary shapes, examples of which include a shape having a taper where a portion of a rectangle is cut off, a circular or substantially circular shape, and an elliptical or substantially elliptical shape, for example.

Figure 4A:
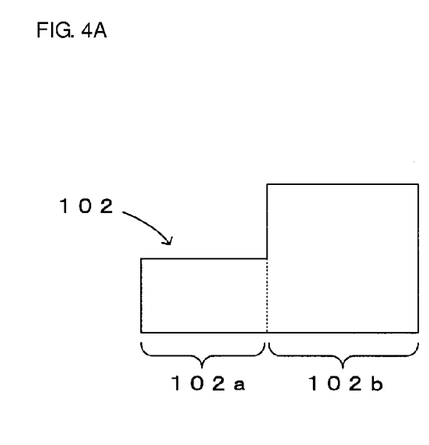
FIGS. 4A and 4B are diagrams illustrating another example of a circuit module according to a preferred embodiment of the present invention.
Figure 4B:
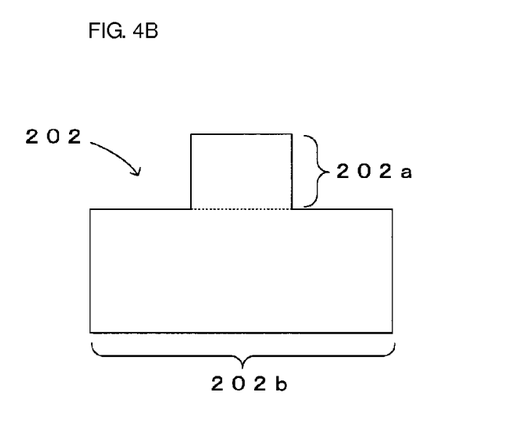

In addition, in the above-mentioned preferred embodiments, the circuit substrate 2 preferably has a rectangular or substantially rectangular shape, for example. However, even in the case of polygonally shaped circuit substrates 102 and 202 illustrated in FIGS. 4A and 4B, the circuit substrate 102 is divided into two rectangular or substantially rectangular regions 102a and 102b, the circuit substrate 202 is divided into two rectangular or substantially rectangular regions 202a and 202b, via conductors connected to mounting electrodes in the vicinity of corner portions are disposed so as to be located closer to the centers of the circuit substrates 102 and 202. In addition, FIGS. 4A and 4B are diagrams illustrating other examples of the circuit module of the present invention, and FIG. 4A and FIG. 4B individually illustrate examples of the circuit substrate.

Various preferred embodiments of the present invention may be applied to various types of circuit modules each of which includes a circuit substrate where a plurality of land-shaped mounting electrodes are located on one main surface.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
   a circuit substrate including one main surface and another main surface opposite to the one main surface;
   a plurality of land-shaped mounting electrodes located on the one main surface of the circuit substrate;
   a via conductor is connected to at least one of the mounting electrodes that is located closest to a corner portion of the one main surface of the circuit substrate;
   at least one electronic component mounted on the another main surface of the circuit substrate; and
   a resin or a metal case arranged on the circuit substrate to cover the at least one electronic component; wherein
   the mounting electrodes are rectangular or substantially rectangular;
   the plurality of mounting electrodes are provided along a periphery of the circuit substrate;
   the via conductor is located in a position in the at least one of the mounting electrodes that is located closer to a central portion of the one main surface of the circuit substrate;
   the via conductor is disposed at a corner of the at least one of the mounting electrodes located farthest from the corner portion of the one main surface of the circuit substrate; and
   the at least one of the mounting electrodes is electrically connected to the at least one electronic component through the via conductor.

2. The circuit module according to claim 1, wherein in the at least one of the mounting electrodes, another via conductor is further connected at a position located closer to the corner portion of the one main surface of the circuit substrate.

3. The circuit module according to claim 1, further comprising:
   an insulation layer located on the one main surface of the circuit substrate; wherein
   the insulation layer is arranged to cover at least a portion of an end surface on the one main surface side of the via conductor located closer to the central portion of the one main surface of the circuit substrate.

4. The circuit module according to claim 3, wherein the insulation layer is arranged to cover circumferential portions of each of the mounting electrodes.

5. The circuit module according to claim 1, wherein the at least one of the mounting electrodes including the via conductor is disposed on a diagonal line in the one main surface of the circuit substrate.

6. The circuit module according to claim 1, wherein the at least one electronic component is one of a semiconductor element, an amplifier, a diode, a switch, a resistance element, a capacitor element, and an inductor element.

7. The circuit module according to claim 1, wherein the circuit module is one of a wireless LAN module and an antenna switch.

8. The circuit module according to claim 1, wherein the circuit substrate is rectangular or substantially rectangular.

9. The circuit module according to claim 1, wherein the circuit substrate is one of a ceramic multilayer substrate, a resin multilayer substrate, a single-layer substrate, and an alumina substrate.

10. The circuit module according to claim 1, wherein the circuit substrate is divided into two rectangular or substantially rectangular regions.

11. The circuit module according to claim 1, further comprising:
   an insulation layer located on the one main surface of the circuit substrate; wherein
   the insulation layer is arranged to cover an entire end surface on the one main surface side of the via conductor located closer to the central portion of the one main surface of the circuit substrate.

* * * * *